United States Patent
Kato et al.

(10) Patent No.: US 9,232,638 B2
(45) Date of Patent: Jan. 5, 2016

(54) PRINTED WIRING BOARD AND METHOD FOR MANUFACTURING THE SAME

(71) Applicant: IBIDEN CO., LTD., Ogaki-shi (JP)

(72) Inventors: Hisashi Kato, Ogaki (JP); Ryojiro Tominaga, Ogaki (JP); Tetsuya Nobutoki, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 228 days.

(21) Appl. No.: 13/975,718

(22) Filed: Aug. 26, 2013

(65) Prior Publication Data

US 2014/0054068 A1 Feb. 27, 2014

(30) Foreign Application Priority Data

Aug. 27, 2012 (JP) ................. 2012-186493

(51) Int. Cl.
| | |
|---|---|
| H05K 1/00 | (2006.01) |
| H05K 1/09 | (2006.01) |
| H05K 1/11 | (2006.01) |
| H05K 1/02 | (2006.01) |
| H05K 3/46 | (2006.01) |

(52) U.S. Cl.
CPC ............ *H05K 1/0284* (2013.01); *H05K 3/4602* (2013.01); *H05K 3/4688* (2013.01); *H01L 2924/0002* (2013.01); *H05K 1/0271* (2013.01); *H05K 3/4644* (2013.01); *H05K 2201/0195* (2013.01); *H05K 2201/029* (2013.01); *H05K 2201/096* (2013.01); *H05K 2201/09136* (2013.01); *Y10T 156/10* (2015.01)

(58) Field of Classification Search
CPC . H05K 1/0271; H05K 3/4602; H05K 3/4644; H05K 3/4688; H05K 2201/0195
USPC ................. 174/251, 257, 258, 262, 264–266
See application file for complete search history.

(56) References Cited

U.S. PATENT DOCUMENTS

| | | | | |
|---|---|---|---|---|
| 2005/0277282 | A1* | 12/2005 | Horikawa et al. | 438/618 |
| 2005/0287714 | A1* | 12/2005 | Walk et al. | 438/127 |
| 2010/0300737 | A1* | 12/2010 | Sato et al. | 174/260 |
| 2011/0051386 | A1* | 3/2011 | Nagasawa et al. | 361/783 |
| 2011/0073358 | A1* | 3/2011 | Hayashi | 174/258 |
| 2012/0085572 | A1* | 4/2012 | Sakai | 174/258 |
| 2012/0153463 | A1* | 6/2012 | Maeda | 257/737 |
| 2012/0205039 | A1* | 8/2012 | Yamada et al. | 156/247 |
| 2012/0246924 | A1* | 10/2012 | Hibino et al. | 29/829 |
| 2012/0306608 | A1* | 12/2012 | Takenaka | 336/200 |
| 2012/0314389 | A1* | 12/2012 | Takenaka | 361/761 |

FOREIGN PATENT DOCUMENTS

JP 2008-085106 4/2008

* cited by examiner

*Primary Examiner* — Timothy Thompson
*Assistant Examiner* — Sherman Ng
(74) *Attorney, Agent, or Firm* — Oblon, McClelland, Maier & Neustadt, L.L.P.

(57) ABSTRACT

A printed wiring board includes a core substrate including resin and inorganic fiber, a first buildup layer formed on a first surface of the substrate and including resin insulating layers and first conductive layers, and a second buildup layer formed on a second surface of the substrate on the opposite side of the core substrate with respect to the first surface and including resin insulating layers and second conductive layers. The first conductive layers in the first buildup have sum V1 of volumes which is greater than sum V2 of volumes of the second conductive layers in the second buildup, and the substrate has a first-surface side portion which has resin amount greater than resin amount of a second-surface side portion of the substrate where boundary between the first-surface and second-surface side portions is set with respect to the center line in the thickness direction of the substrate.

20 Claims, 14 Drawing Sheets

| Leg | COMPARATIVE EXAMPLE | EXAMPLE 1 | EXAMPLE 2 | EXAMPLE 3 | EXAMPLE 4 | EXAMPLE 5 | EXAMPLE 6 | EXAMPLE 7 |
|---|---|---|---|---|---|---|---|---|
| RESIN RATIO (%) OF FIRST INSULATING LAYER | 68.6 | 72.5 | 75.0 | 77.0 | 79.0 | 80.0 | 82.5 | 84.9 |
| RESIN RATIO (%) OF SECOND INSULATING LAYER | 68.6 | 68.6 | 68.6 | 68.6 | 68.6 | 68.6 | 68.6 | 68.6 |
| DIFFERENCE (%) IN RESIN RATIO BETWEEN FIRST AND SECOND INSULATING LAYERS | 0 | 3.9 | 6.4 | 8.4 | 10.4 | 11.4 | 13.9 | 16.3 |
| WARPAGE AMOUNT (μm) | 6.9 | 5.9 | 5.4 | 5.1 | -5.5 | -5.6 | -6.1 | -6.5 |

(A)

(B)

PRINTED WIRING BOARD AND METHOD FOR MANUFACTURING THE SAME

CROSS-REFERENCE TO RELATED APPLICATIONS

The present application is based upon and claims the benefit of priority from Japanese Application No. 2012-186493, filed Aug. 27, 2012, the entire contents of which are incorporated herein by reference.

BACKGROUND OF THE INVENTION

1. Field of the Invention

The present invention relates to a printed wiring board including a core substrate and buildup layers formed on upper and lower surfaces of the core substrate, and a method of manufacturing the same.

2. Description of Background Art

In a printed wiring board described in JP 2008-85106 A, a core substrate constructed by laminating three resin layers formed by impregnating resin into fibers arranged in one direction is used. The number of fibers per length of resin layer positioned in the center of the resin layers is set to be greater than the number of fibers per length of other resin layers. Therefore, the thermal expansion coefficient in a planar direction becomes uniform over the entire core substrate, and warpage of the printed wiring board and undulation of the surface of the printed wiring board are suppressed. The entire contents of this publication are incorporated herein by reference.

SUMMARY OF THE INVENTION

According to one aspect of the present invention, a printed wiring board includes a core substrate including a resin and an inorganic fiber, a first buildup layer formed on a first surface of the core substrate and including resin insulating layers and first conductive layers, and a second buildup layer formed on a second surface of the core substrate on the opposite side of the core substrate with respect to the first surface and including resin insulating layers and second conductive layers. The first conductive layers in the first buildup layer have a sum V1 of volumes which is greater than a sum V2 of volumes of the second conductive layers in the second buildup layer, and the core substrate has a first-surface side portion which has a resin amount greater than a resin amount of a second-surface side portion of the core substrate where a boundary line between the first-surface side portion and second-surface side portion of the core substrate is set with respect to a center line in the thickness direction of the core substrate.

According to another aspect of the present invention, a method of manufacturing a printed wiring board includes forming a core substrate including a resin and an inorganic fiber, forming on a first surface of the core substrate a first buildup layer including resin insulating layers and first conductive layers, and forming on a second surface of the core substrate on the opposite side of the core substrate with respect to the first surface a second buildup layer including resin insulating layers and second conductive layers. The first conductive layers in the first buildup layer has a sum V1 of volumes which is greater than a sum V2 of volumes of the second conductive layers in the second buildup layer, and the forming of the core substrate includes forming the core substrate having a first-surface side portion which has a resin amount greater than a resin amount of a second-surface side portion of the core substrate where a boundary line between the first-surface side portion and second-surface side portion of the core substrate is set with respect to a center line in the thickness direction of the core substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a table listing simulation results of the amount of warpage obtained by adjusting a resin amount of a first resin layer of the core substrate and a resin amount of a second resin layer of the core substrate in a printed wiring board having the configuration of the first embodiment;

DETAILED DESCRIPTION OF THE EMBODIMENTS

Figure 1:
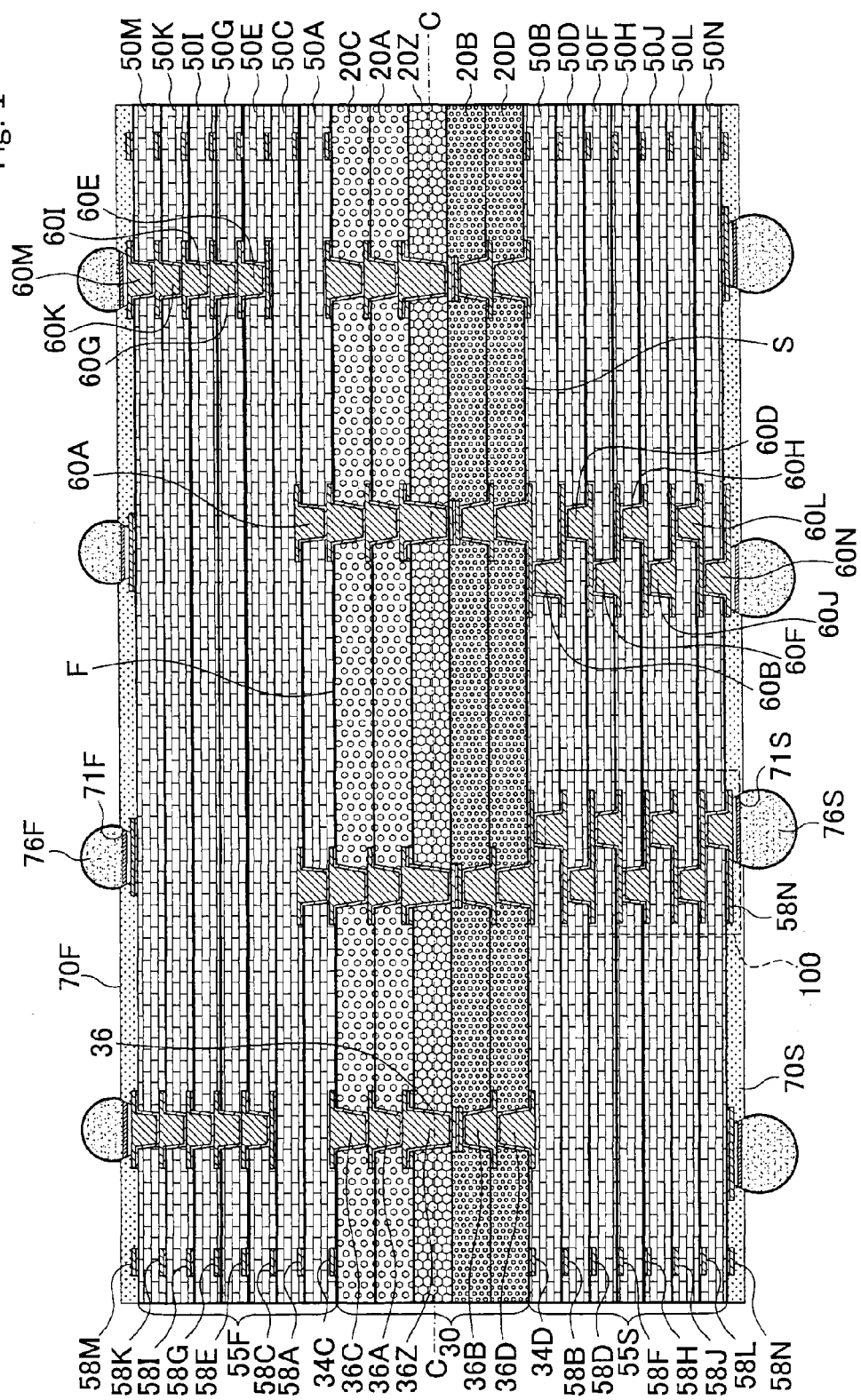
FIG. 1 is a cross-sectional view illustrating a printed wiring board according to a first embodiment of the invention.

The embodiments will now be described with reference to the accompanying drawings, wherein like reference numerals designate corresponding or identical elements throughout the various drawings.

First Embodiment

FIG. 1 is a cross-sectional view illustrating a printed wiring board according to a first embodiment.

Figure 2:
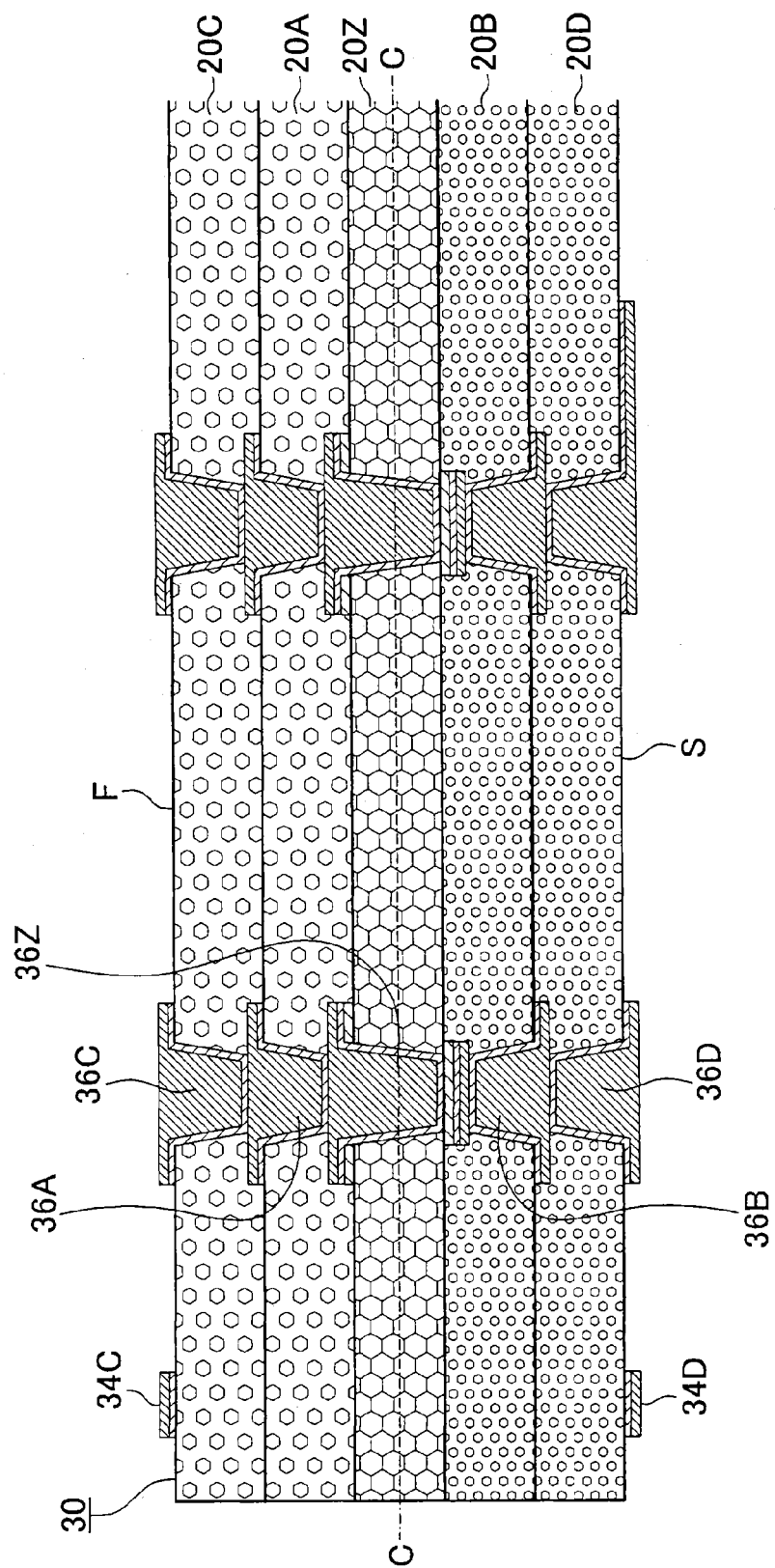
FIG. 2 is an enlarged view illustrating a core substrate.
Figure 3:
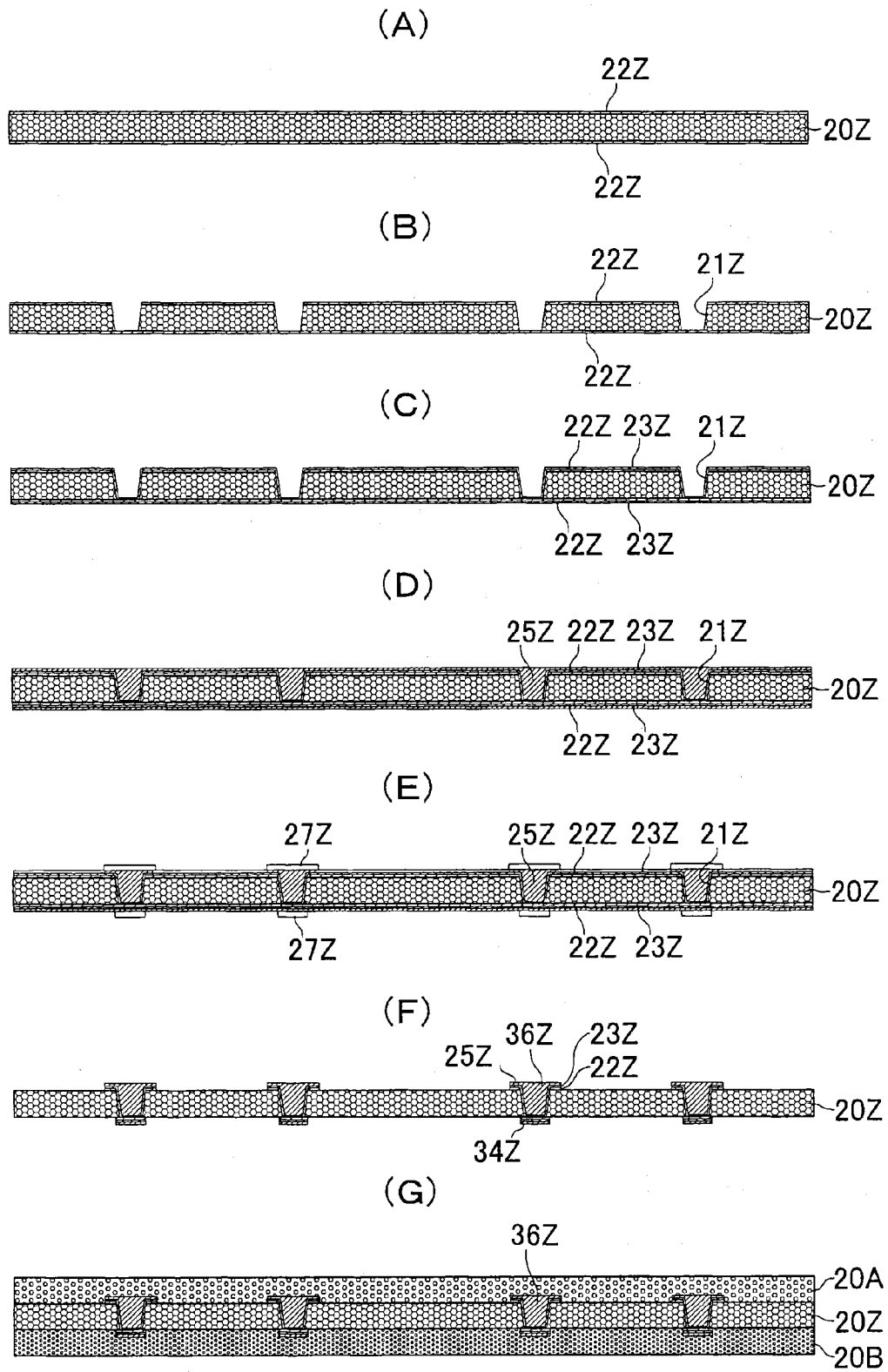
FIG. 3 is a diagram illustrating processes of a method of manufacturing the printed wiring board according to the first embodiment of the invention.
Figure 4:
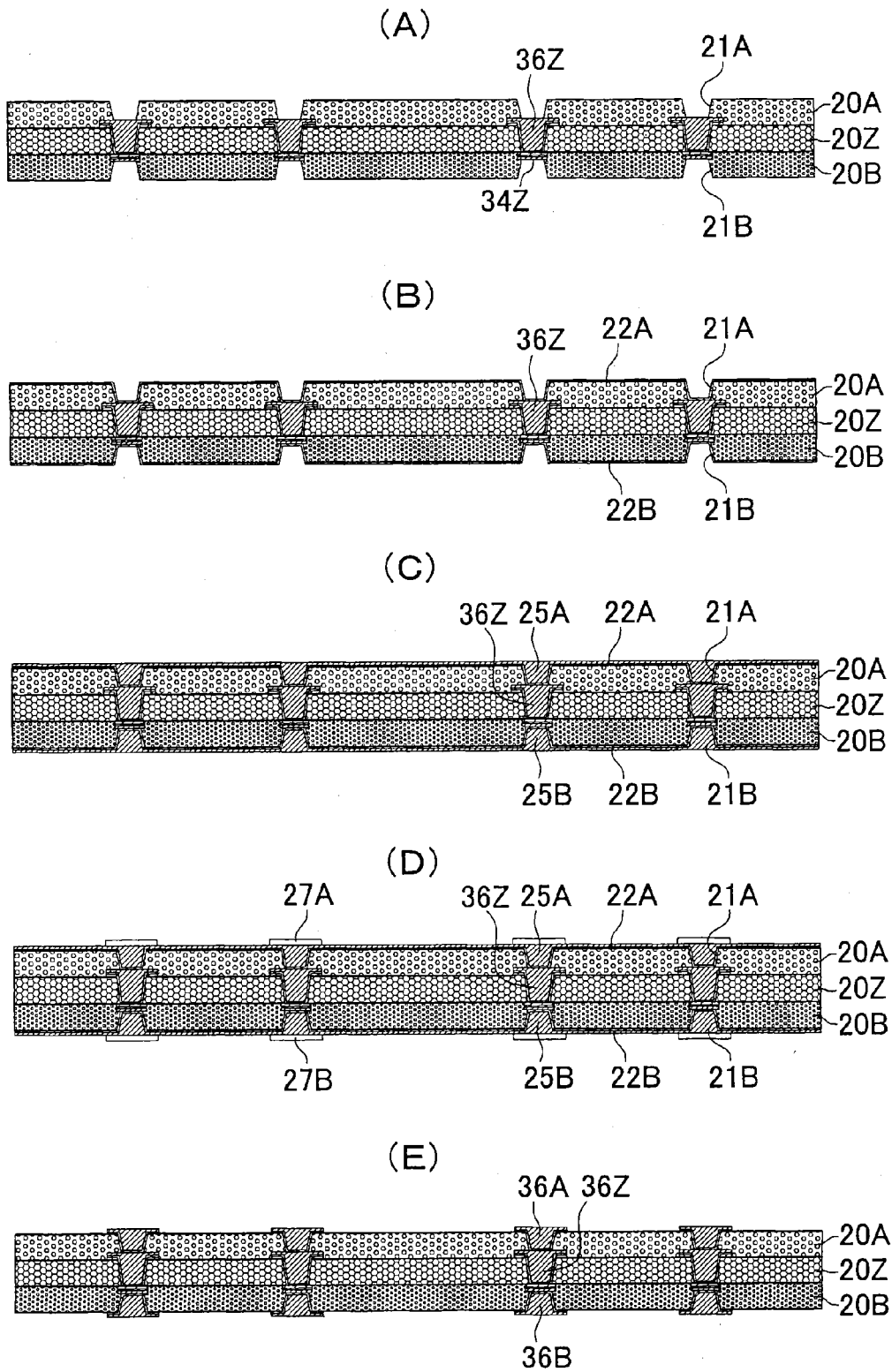
FIG. 4 is a diagram illustrating processes of the method of manufacturing the printed wiring board according to the first embodiment of the invention.
Figure 5:
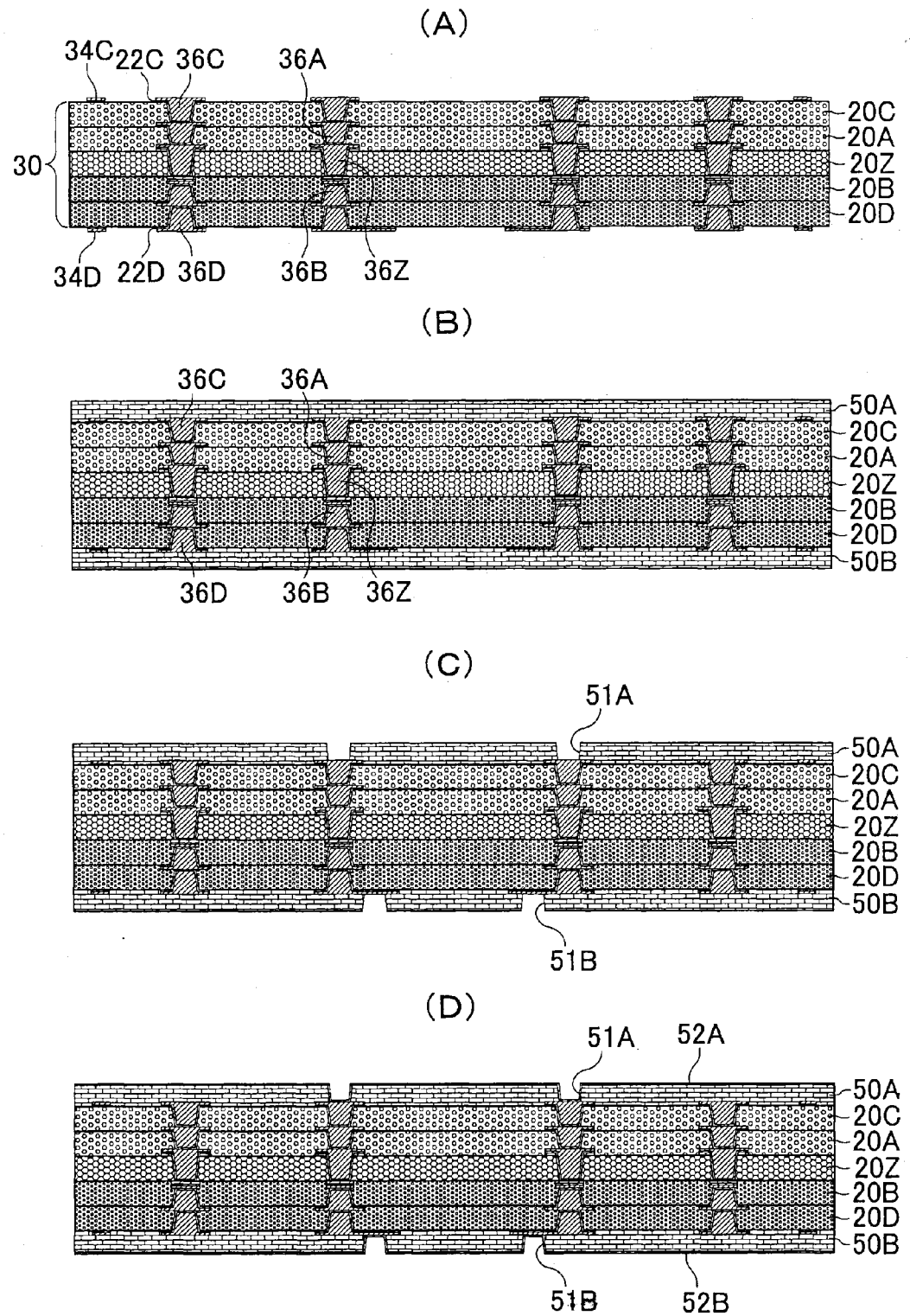
FIG. 5 is a diagram illustrating processes of the method of manufacturing the printed wiring board according to the first embodiment of the invention.
Figure 6:
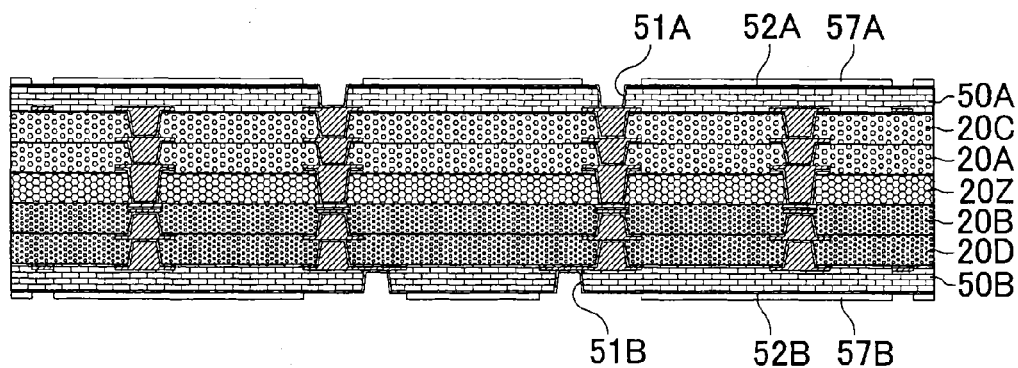
FIG. 6 is a diagram illustrating processes of the method of manufacturing the printed wiring board according to the first embodiment of the invention.
Figure 6:
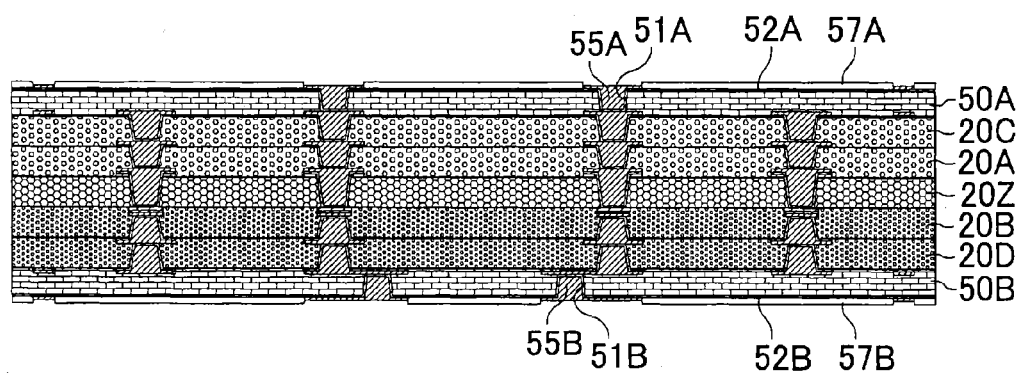
Figure 6:
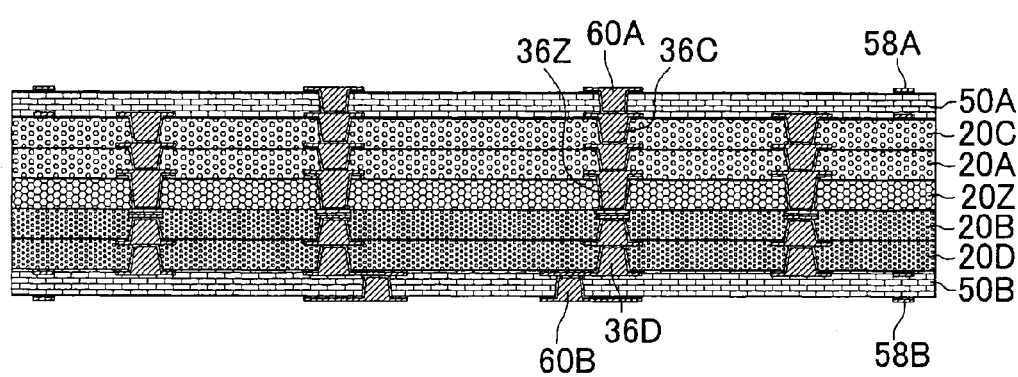

Printed wiring board 10 includes core substrate 30 having first surface (F) on which a semiconductor device (not illustrated) is mounted and second surface (S) opposite the first surface. FIG. 2 is an enlarged view illustrating the core substrate. Core substrate 30 includes central insulating layer (20Z) positioned in the central portion thereof, first insulating layers (20A, 20C) positioned on the first-surface (F) side, and second insulating layers (20B, 20D) positioned on the second-surface (S) side. Via conductors (36Z) are formed in central insulating layer (20Z); via conductors (36A, 36C) are formed in first insulating layers (20A, 20C); via conductors (36C, 36D) are formed in second insulating layers (20B, 20D). Connection conductor 36 is structured with via conductors (36Z, 36A, 36C, 36B, 36D) to connect the first and second surfaces of the core substrate. Conductive pattern (34C) is formed on the first-surface side of core substrate 30, and conductive pattern (34D) is formed on the second-surface side.

The central insulating layer, the first insulating layers and the second insulating layers of core substrate 30 contain inorganic fiber-reinforcing materials. The inorganic fiber-reinforcing materials are not particularly limited. Examples of the inorganic fiber-reinforcing materials include glass cloth, glass non-woven fabric, aramid cloth, aramid non-woven fabric, and the like.

First buildup layer (55F) is formed on the first-surface side of core substrate 30, and second buildup layer (55S) is formed on the second-surface side. It is preferable for at least one of the resin insulating layers of buildup layers (55F, 55S) to contain an inorganic fiber-reinforcing material. In this case, the printed wiring board has rigidity, and warpage is easily suppressed.

First conductive layer (58A) is formed on first resin insulating layer (50A) where first buildup layer (55F) is formed on the first surface of core substrate 30. First conductive layer (58A) and conductive pattern (34C) are connected to each other by first via conductor (60A). First resin insulating layers (50C, 50E, 50G, 50I, 50K, 50M) are sequentially laminated on first resin insulating layer (50A) and first conductive layer (58A). First conductive layers (58C, 58E, 58G, 58I, 58K, 58M) are formed on first resin insulating layers (50C, 50E, 50G, 50I, 50K, 50M), respectively. Next, the upper and lower first conductive layers are connected to each other by first via conductors (60C, 60E, 60G, 60I, 60K, 60M), which are formed in the resin insulating layers.

On the other hand, second conductive layer (58B) is formed on second resin insulating layer (50B) where second buildup layer (55S) is formed on the second-surface side of core substrate 30. Second conductive layer (58B) and conductive pattern (34D) are connected to each other by second via conductor (60B). Second resin insulating layers (50D, 50F, 50H, 50J, 50L, 50N) are sequentially laminated on second resin insulating layer (50B) and second conductive layer (58B). Second conductive layers (58D, 58F, 58H, 58J, 58L, 58N) are formed on second resin insulating layers (50D, 50F, 50H, 50J, 50L, 50N), respectively. Next, the upper and lower second conductive layers are connected to each other by second via conductors (60D, 60F, 60H, 60J, 60L, 60N), which are formed in the resin insulating layers. Inductor 100 constructed with second conductive layers (58D, 58F, 58H, 58J, 58L, 58N) is received in the second buildup layer.

Solder resist layer (70F) including openings (71F) is formed on resin insulating layer (50M) of the outermost layer on the upper-surface side. Solder bumps (76F) for connecting the semiconductor device are formed in openings (71F). Solder resist layer (70S) including openings (71S) is formed on resin insulating layer (50N) of the outermost layer on the lower-surface side. Solder bumps (76S) for connection with an external board such as a motherboard are formed in openings (71S).

In the printed wiring board according to the first embodiment, the volume (=area) of first conductive layers (58A, 58C, 58E, 58G, 58I, 58K, 58M) of first buildup layer (55F) is greater than the volume (=area) of second conductive layers (58B, 58D, 58F, 58H, 58J, 58L, 58N) of second buildup layer (55S). Therefore, during thermal contraction, stress is exerted on first buildup layer (55F) and second buildup layer (55S) in such a way that the central portion is raised and the end portions are lowered to cause second buildup layer (55S) to contract (protruding upward).

Therefore, in core substrate 30 according to the first embodiment, the resin amount of first resin layers (20A, 20C) on the first-surface side of center line CC in the thickness direction of the core substrate is adjusted to be 10.4% greater than the resin amount of second resin layers (20B, 20D) on the second-surface side of center line CC in the thickness direction of the core substrate. Namely, the resin ratio (the resin weight of immersed resin) of first resin layers (20A, 20C) is set at 79%, and the resin weight of second insulating layers (20B, 20D) is set at 68.6%. It is thought that due to the difference in resin weight, core substrate 30 warps in a direction that causes the first-surface side to contract (protruding downward). Namely, core substrate 30 warps slightly in a direction opposite the warping direction of the printed wiring board during the process of forming the buildup layer.

As described above in detail with reference to FIG. 2, core substrate 30 includes central insulating layer (20Z) positioned in the central portion, first insulating layers (20A, 20C) positioned on the first-surface (F) side, and second insulating layers (20B, 20D) positioned on the second-surface (S) side. In addition, it is preferable for the thickness of first insulating layers (20A, 20C) on the first-surface (F) side and the thickness of second insulating layers (20B, 20D) on the second-surface (S) side to be equal in terms of simplifying the manufacturing processes.

In order to adjust the resin amount, the thickness of the inorganic fiber contained in first insulating layers 20A and (20C) is smaller than the thickness of the inorganic fiber contained in the second insulating layers (20B, 20D). Namely, the thickness per unit item of glass cloth, glass non-woven fabric, aramid cloth, aramid non-woven fabric, or the like used as inorganic fiber-reinforcing material is different between the first insulating layer and the second insulating layer. In addition, due to the difference in the content of the inorganic fiber, the thickness of the inorganic fiber is different between the first insulating layer and the second insulating layer.

As described above, sum V1 of the volumes of the first conductive layers (58A, 58C, 58E, 58G, 58I, 58K, 58M) of first buildup layer (55F) is greater than sum V2 of the volumes of second conductive layers (58B, 58D, 58F, 58H, 58J, 58L, 58N) of second buildup layer (55S).

When a ratio (V1/V2) of sum V1 of the volumes of the first conductive layers to sum V2 of the volumes of the second conductive layers satisfies the following Formula (1), $$1 < V1/V2 \leq 1.2 \qquad \text{Formula (1)}$$

it is preferable for the difference in the resin amount between the first-surface side of the core substrate and the second-surface side thereof to be in a range of 10 wt % to 20 wt %.

In this case, the printed wiring board can be set to warp in a desired direction so as to make it easier to mount a semiconductor device thereon. In a case where the difference is less than 10 wt %, during the process of forming the buildup layers, the printed wiring board is easily influenced by the warpage caused by the difference in conductor volume between two sides. On the other hand, in a case where the difference is more than 20 wt %, warpage of the core substrate itself increases, making warpage difficult to suppress during the process of forming the buildup layers.

In the core substrate, the thickness of central insulating layer (20Z) positioned in the central portion, the thickness of first insulating layers (20A, 20C) positioned on the first-surface (F) side, and the thickness of second insulating layers (20B, 20D) positioned on the second-surface (S) side are substantially equal to each other. Therefore, in manufacturing the core substrate, the press conditions of the insulating layers are equalized, thereby simplifying the manufacturing processes.

Method of Manufacturing Printed Wiring Board According to First Embodiment

FIGS. 3 to 8 illustrate a method for manufacturing the printed wiring board according to the first embodiment.

A double-sided copper-clad laminate (CCL-IIL832NSLC) is prepared as a starting material (FIG. 3A) where copper foils (22Z, 22Z) are laminated on both surfaces of insulating layer (20Z), which is formed with prepreg obtained by impregnating a glass cloth core material with epoxy resin.

Using a laser, via openings (21Z) are formed to penetrate through copper foil (22Z) and insulating layer (20Z) of one surface side (FIG. 3B). Next, electroless plating film (23Z) is formed (FIG. 3C). An electrolytic plating process is performed, and electrolytic plating film (25Z) is formed on the surface or in openings (21Z) (FIG. 3D). An etching resist (27Z) in a predetermined pattern is formed on the electrolytic plating film (FIG. 3D). Electrolytic plating film (25Z), electroless plating film (23Z) and copper foils (22Z) are removed from where no etching resist is formed (FIG. 3E). Etching resist (27Z) is removed, and via conductor (36Z) and conductive pattern (34A), formed with copper foils (22Z), electroless plating film (23Z) and electrolytic plating film (25Z), are formed (FIG. 3F).

First insulating layer (20A) is laminated on the upper surface of insulating layer (20Z), and second insulating layer (20B) is laminated on the lower surface of insulating layer (20Z) (FIG. 3G). As described above, the resin ratio of first resin layer (20A) is set at 79%, and the resin weight of second insulating layer (20B) is set at 68.6%. By using a laser, via openings (21A) reaching via conductor (36Z) are formed on the first insulating layer (20A) side, and via openings (21B) reaching the conductive pattern (24Z) are formed on the second insulating layer (20B) side (FIG. 4A). Electroless plating films (22A, 22B) are formed (FIG. 4B). An electrolytic plating process is performed, and electrolytic plating films (25A, 25B) are formed on the surface and in openings (21A, 21B) (FIG. 4C). Etching resists (27A, 27B) are formed in a predetermined pattern on the electrolytic plating film (FIG. 4D). Electrolytic plating films (25A, 25B) and electroless plating films (22A, 22B) are removed from where no etching resist is formed, and the etching resist is removed so that via conductors (36A, 36B) constructed with electroless plating films (22A, 22B) and electrolytic plating films (25A, 25B) are formed (FIG. 4E).

The processes illustrated in FIG. 3G to FIG. 4E are repeated, so that core substrate 30 of the embodiment is completed by laminating the first insulating layer (20C) including via conductor (36C) and conductive pattern (34C), and second insulating layer (20D) including via conductor (36D) and conductive pattern (34D) (FIG. 5A). At this time, core substrate 30 warps to protrude downward.

Resin films for interlayer insulating layers containing an inorganic fiber-reinforcing material (glass cloth core material or the like) are laminated on the first and second surfaces of core substrate 30, and resin insulating layers (50A, 50B) are formed by thermal curing (FIG. 5B).

By using $CO_2$ gas laser, openings (51A) are formed in resin insulating layer (50A), and openings (51B) are formed in resin insulating layer (50B) (FIG. 5C). By being immersed in an oxidizing agent such as a chromic acid or permanganate, the surfaces of resin insulating layers (50A, 50B) are roughened (not illustrated).

By applying a catalyst such as palladium to the surfaces of resin insulating layers (50A, 50B) and immersing them in an electroless plating solution for 5 to 60 minutes, electroless plating films (52A, 52B) are provided in a range of 0.1 μm to 5 μm (FIG. 5D).

A commercially available photosensitive dry film is pasted on the laminate on which the above-described processes are performed, a photomask film is placed thereon, and an exposing process is performed. Next, a developing process is performed by using sodium carbonate, so that plating resists (57A, 57B) having a thickness of 15 μm are formed (FIG. 6A). Electrolytic plating films (55A, 55B) are formed by performing the electrolytic plating process (FIG. 6B).

After the plating resist is peeled off using 5% NaOH, electroless plating films (52A, 52B) under the plating resist are dissolved and removed by etching. Therefore, conductive patterns (58A, 58B) having a thickness of about 15 μm, which are constructed with electroless plating films (52A, 52B) and electrolytic plating films (55A, 55B), are formed along with via conductors (60A) and (60B) (FIG. 6C). Next, the surfaces of conductive patterns (58A, 58B) and the surfaces of via conductors (60A, 60B) are roughened by an etching solution containing a cupric complex and an organic acid (not illustrated).

Figure 7:
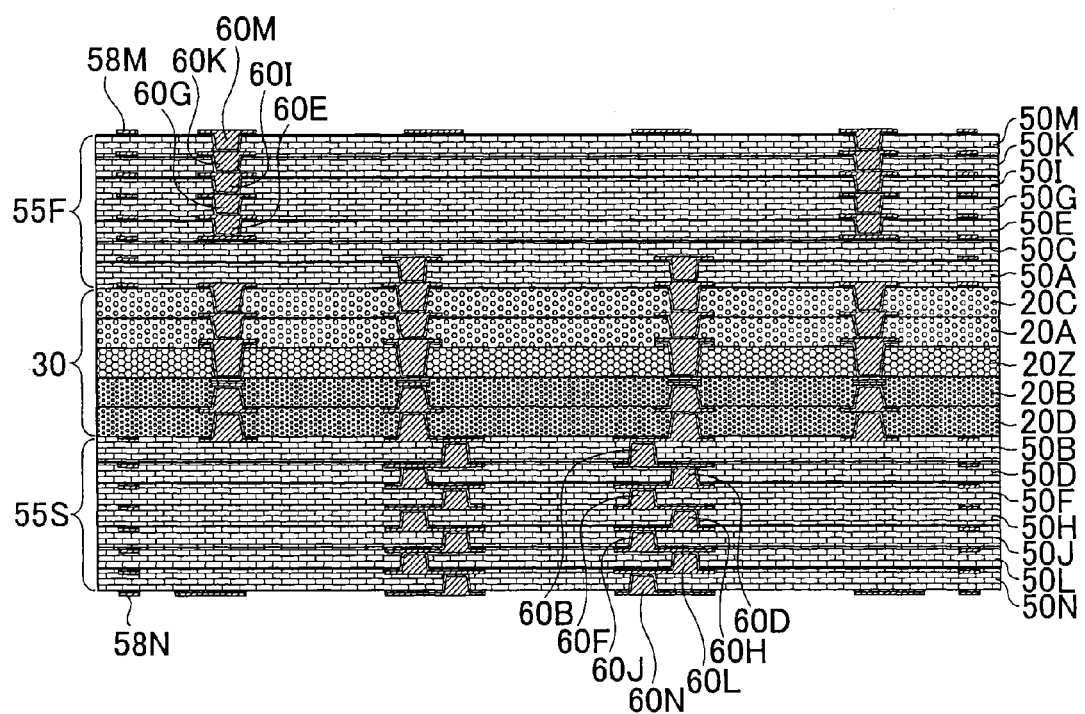
FIG. 7 is a diagram illustrating processes of the method of manufacturing the printed wiring board according to the first embodiment of the invention.
Figure 8:
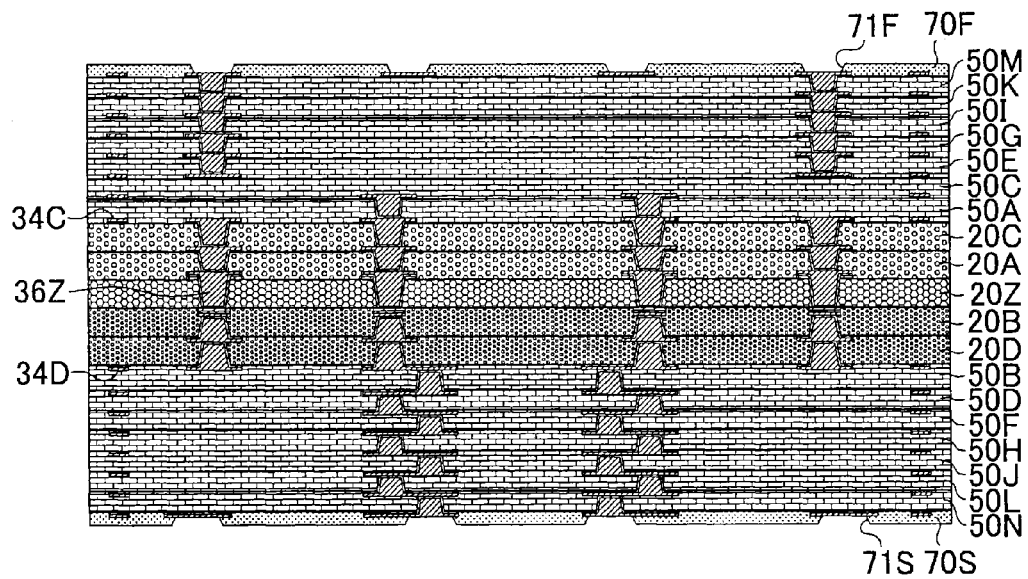
FIG. 8 is a diagram illustrating processes of the method of manufacturing the printed wiring board according to the first embodiment of the invention.
Figure 8:
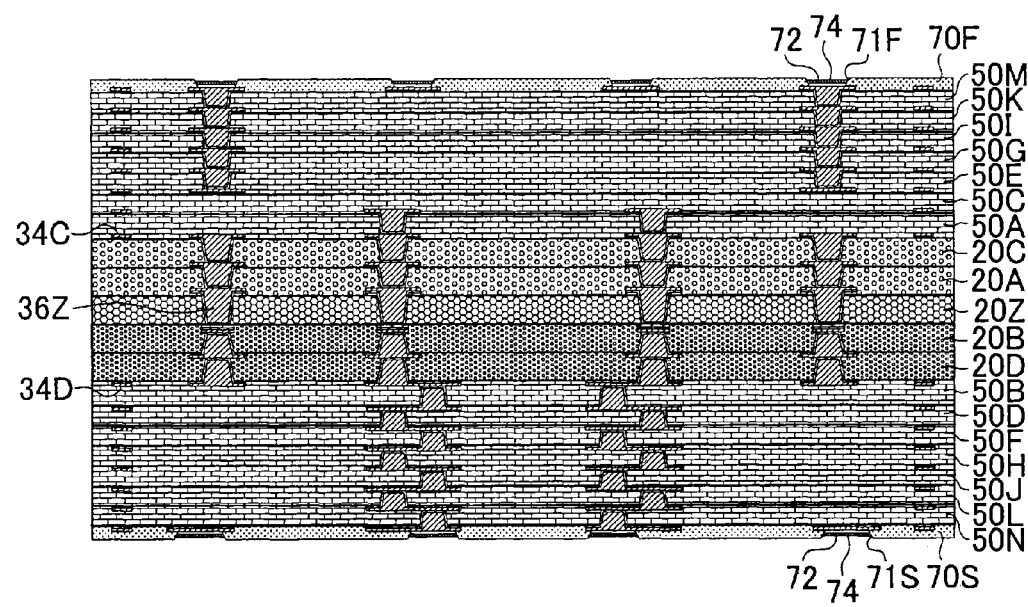

The processes illustrated in FIG. 5B to FIG. 6C are repeated, so that first buildup layer (55F) is formed on the first surface of core substrate 30 and second buildup layer (55S) is formed on the second surface thereof (FIG. 7).

Next, a commercially available solder resist composition is applied, exposing and developing processes are performed, solder resist layer (70F) including openings (71 F) is formed on first buildup layer (55F), and solder resist layer (70S) including openings (71S) is formed on second buildup layer (55S) (FIG. 8A).

The laminate is immersed in an electroless nickel plating solution, so that nickel plating layers 72 are formed in openings (71F) and (71S). In addition, the laminate is immersed in an electroless gold plating solution, so that gold plating layers 74 are formed on nickel plating layers 72 (FIG. 8B). Instead of nickel-gold layers, nickel-palladium-gold layers may be formed.

Solder balls are mounted in openings 71, and reflow is performed, so that solder bumps (76F) are formed on the upper-surface side, and solder bumps (76S) are formed on the lower-surface side. Therefore, printed wiring board 10 is completed (FIG. 1).

Core substrate 30 according to the first embodiment warps to protrude downward. In addition, sum V1 of the volumes of first conductive layers (58A, 58C, 58E, 58G, 58I, 58K, 58M) of first buildup layer (55F) is greater than sum V2 of the volumes of second conductive layers (58B, 58D, 58F, 58H, 58J, 58L, 58N) of second buildup layer (55S). In this case, it is thought that, during the process of forming buildup layers (55F) and (55S), the thermal contraction amount of the buildup layer (second buildup layer (55S)), of which the sum of volumes of conductive layers is smaller, is relatively greater, and core substrate 30 warps to protrude upward. However, in the embodiment, since the buildup layers are formed on core substrate 30 which warps to protrude downward in advance, the thermal stress causing the thermal contraction is offset by core substrate 30 and weakened. As a result, warpage of printed wiring board 10 is considered to be suppressed.

Herein, in the embodiment, the thickness of first insulating layers (20A, 20C) and the thickness of second insulating layers (20B, 20D) on the second-surface (S) side are set to be equal. However, the thickness of the first insulating layers and the thickness of the second insulating layers may be set to be different from each other.

Namely, in this case, by changing the thickness of the insulating layers, the resin amount of first insulating layers (20A, 20C) and the resin amount of second insulating layers (20B, 20D) are adjusted.

Second Embodiment

Figure 11:
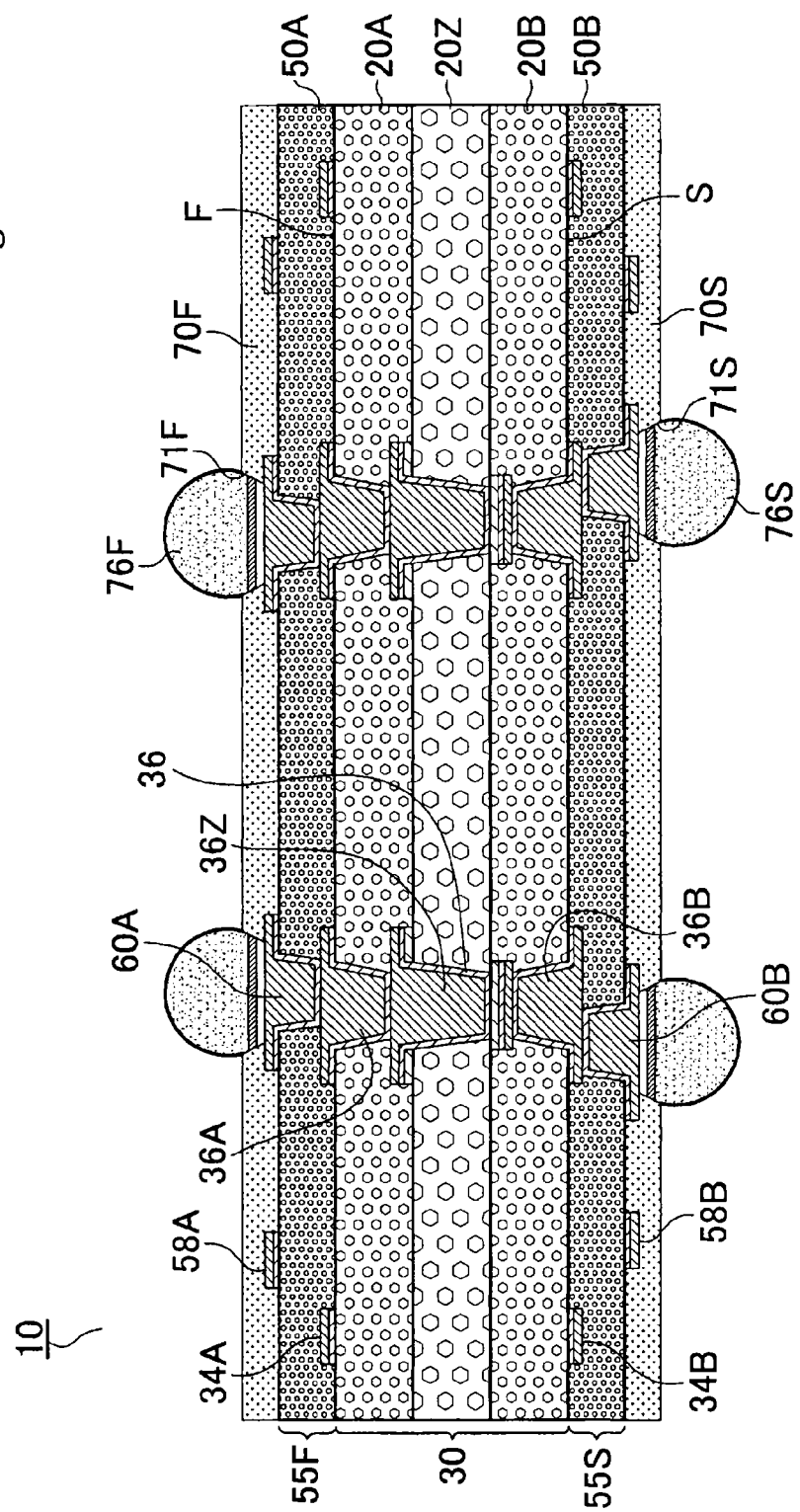
FIG. 11 is a cross-sectional view illustrating a printed wiring board according to a second embodiment of the invention.

FIG. 11 is a cross-sectional diagram illustrating a printed wiring board according to a second embodiment.

Printed wiring board 10 includes core substrate 30 having first surface (F) on the side where a semiconductor device (not illustrated) is mounted and second surface (S) opposite the first surface. Core substrate 30 includes central insulating layer (20Z) positioned in the central portion thereof, first insulating layer (20A) positioned on the first-surface (F) side, and insulating layer (20B) positioned on the second-surface (S) side. Via conductors (36Z) are formed in central insulating layer (20Z); via conductors 36A are formed in first insulating layer (20A); via conductors 36C are formed in second insulating layer (20C). Through-hole conductors 36 are structured with via conductors (36Z, 36A, 36B) to connect the first and second surfaces of the core substrate. Conductive pattern (34A) is formed on the first-surface side of core substrate 30; and conductive pattern (34B) is formed on the second-surface side. The central insulating layer, the first insulating layer, and the second insulating layer of core substrate 30 contain inorganic fiber-reinforcing materials.

First buildup layer (55F) is formed on the first-surface side of core substrate 30, and second buildup layer (55S) is formed on the second-surface side. The resin insulating layers of buildup layers (55F, 55S) contain inorganic fiber-reinforcing materials.

First conductive layer (58A) is formed on first resin insulating layer (50A) where first buildup layer (55F) is formed on the first surface of core substrate 30. First conductive layer (58A) and conductive pattern (34C) are connected to each other by first via conductor (60A).

On the other hand, second conductive layer (58B) is formed on second resin insulating layer (50B) where second buildup layer (55S) on the second surface of core substrate 30 is formed. Second conductive layer (58B) and conductive pattern (34D) are connected to each other by second via conductor (60B).

Solder resist layer (70F) including openings (71F) is formed on first resin insulating layer (50A) on the upper-surface side. Solder bumps (76F) for connecting the semiconductor device are formed in openings (71F). Solder resist layer (70S) including openings (71S) is formed on second resin insulating layer (50B) on the lower-surface side. Solder bumps (76S) for connection with an external board such as a motherboard are formed in openings (71S).

In the printed wiring board according to the second embodiment, the volume (=area) of first conductive layer (58A) of first buildup layer (55F) is greater than the volume (=area) of second conductive layer (58B) of second buildup layer (55S). Therefore, during thermal contraction, stress is exerted on first buildup layer (55F) and second buildup layer (55S) in such a way that the central portion is raised and the end portions are lowered to cause second buildup layer (55S) to contract (protruding upward).

Therefore, in the second embodiment, the resin amount of first resin layer (20A) of core substrate 30 is adjusted to be 10.4% greater than the resin amount of second resin layer (20B). Therefore, the same effects are achieved as those of the above-described first embodiment.

Figure 14:
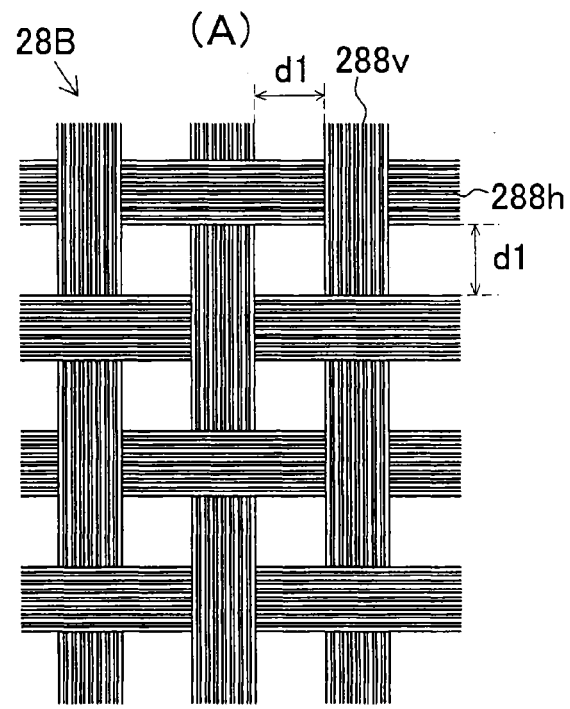
FIG. 14A is a plan view illustrating a woven fabric of a core material of a second insulating layer of the second embodiment.
FIG. 14B is a plan view illustrating a woven fabric of a core material of a first insulating layer.
Figure 14:
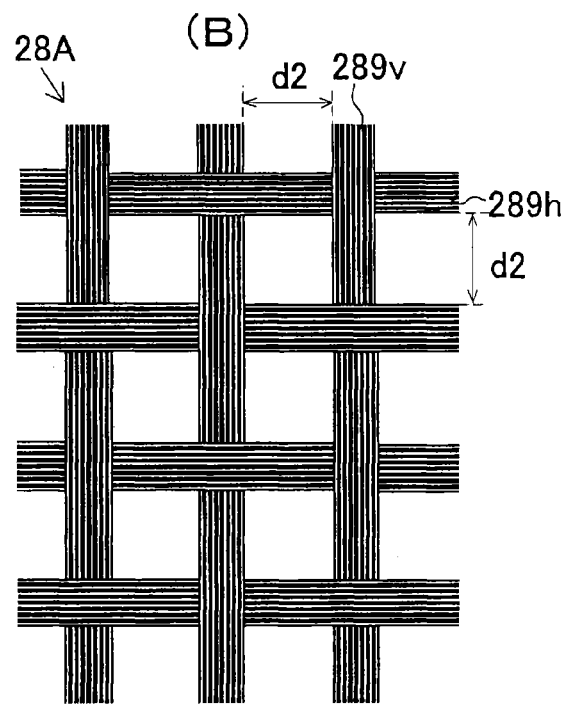

FIG. 14A is a plan view illustrating a woven fabric of the core material of the second insulating layer according to the second embodiment, and FIG. 14B is a plan view illustrating a woven fabric of the core material of the first insulating layer.

Width (d1) of a gap between warp yarns (288v) and weft yarns (288h) of woven fabric (28B) of the core material of second insulating layer (20B) is smaller than width (d2) of a gap between warp yarns (289v) and weft yarns (289h) of woven fabric (28A) of the core material of first insulating layer (20A).

In the printed wiring board according to the second embodiment, the air permeability of the woven fabric (inorganic fiber) contained in first insulating layer (20A) is higher than the air permeability of the inorganic fiber contained in second insulating layer (20B). Air permeability is measured based on JISR3420 . It is preferable for a high opening process to be performed on the inorganic fiber contained in the second insulating layer. The high opening process may be any one of processes capable of obtaining a high degree of opening, which is used for general opening. For example, there are processes such as opening by water flow, opening by high frequency vibration using a liquid as a medium, increasing the width of yarn by performing a process under pressure of a roll, and decreasing the gap in a woven fabric base material or a glass woven fabric, but the opening process is not limited to a particular processing method.

In addition, it is preferable for first base material (28A) and second base material (28B) to be formed with the same material. According to the configuration, symmetry is secured, so that warpage of printed wiring board 10 can be effectively suppressed.

Third Embodiment

Figure 12:
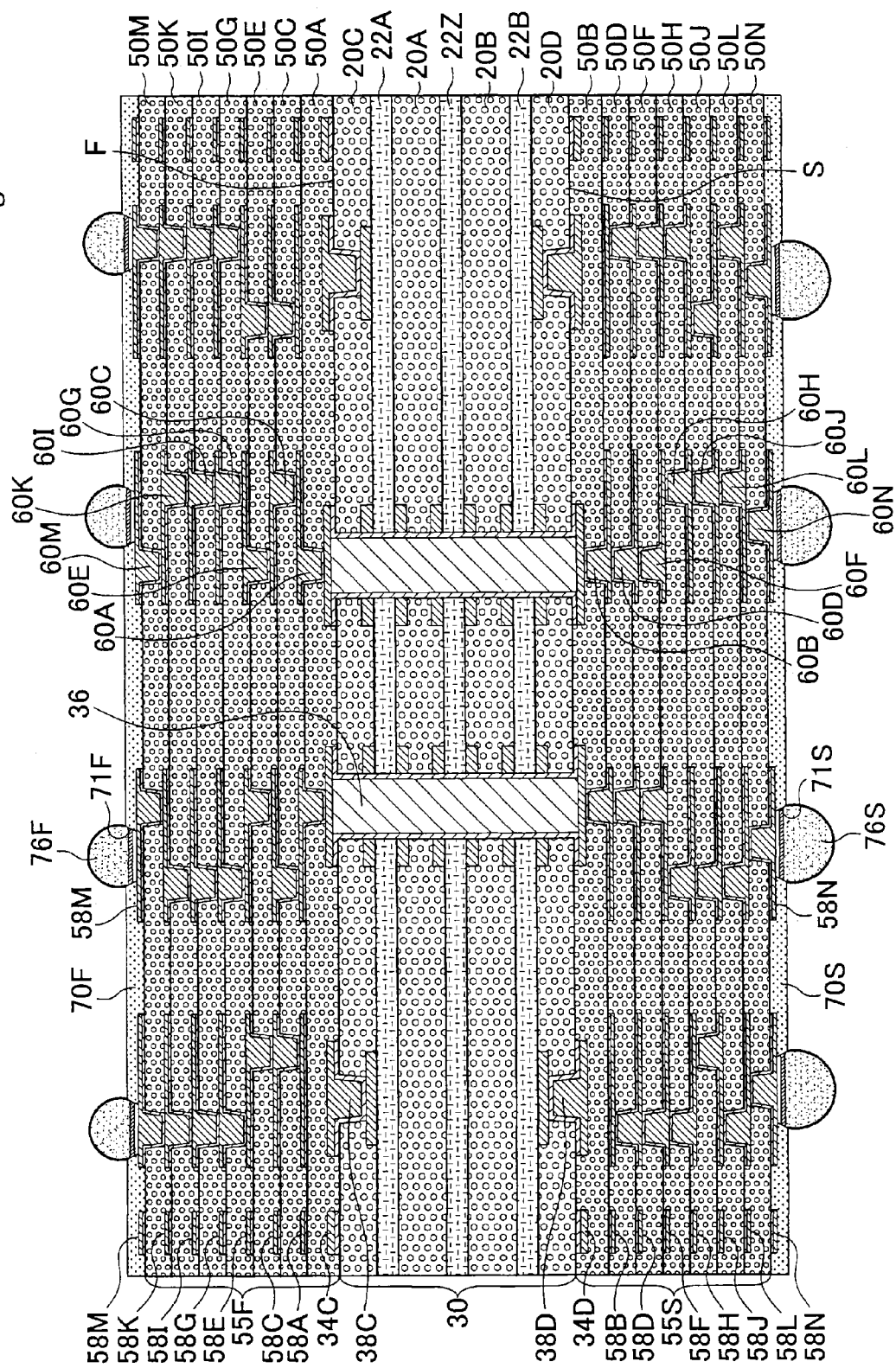
FIG. 12 is a cross-sectional view illustrating a printed wiring board according to a third embodiment of the invention.

FIG. 12 is a cross-sectional diagram illustrating a printed wiring board according to a third embodiment.

Printed wiring board 10 includes core substrate 30 having first surface (F) on the side where a semiconductor device (not illustrated) is mounted and second surface (S) opposite the first surface. Core substrate 30 includes first insulating layers (20A, 20C) positioned on the first-surface (F) side and second insulating layers (20B) and (20D) positioned on the second-surface (S) side. First insulating layers (20A, 20C) and second insulating layers (20B, 20D) are connected to each other through adhesive layers (22A, 22Z, 22B). Through-hole conductors 36 which penetrate through first insulating layers (20A, 20C) and second insulating layers (20B, 20D) to connect the first surface and second surface are formed in core substrate 30. Via conductors (38C) are formed in first insulating layer (20C) of the outermost layer, and via conductors (38D) are formed in second insulating layer (20D) of the outermost layer. Conductive pattern (34C) is formed on the first-surface side of core substrate 30, and conductive pattern (34D) is formed on the second-surface side. The first insulating layer and the second insulating layer of core substrate 30 contain inorganic fiber-reinforcing materials.

First buildup layer (55F) is formed on the first-surface side of core substrate 30, and second buildup layer (55S) is formed on the second-surface side.

First conductive layer (58A) is formed on first resin insulating layer 50A where first buildup layer (55F) is formed on the first surface of core substrate 30. First conductive layer (58A) and conductive pattern (34C) are connected to each other by first via conductor (60A). First resin insulating layers (50C, 50E, 50G, 50I, 50K, 50M) are sequentially laminated on first resin insulating layer (50A) and the first conductive layer (58A). First conductive layers (58C, 58E, 58G, 58I, 58K, 58M) are formed on first resin insulating layers (50C, 50E, 50G, 50I, 50K, 50M), respectively. Next, the upper and lower first conductive layers are connected to each other by first via conductors (60C, 60E, 60G, 60I, 60K, 60M), which are formed in the resin insulating layers.

On the other hand, second conductive layer (58B) is formed on second resin insulating layer (50B) where second buildup layer (55S) is formed on the second-surface side of core substrate 30. Second conductive layer (58B) and conductive pattern (34D) are connected to each other by second via conductor (60B). Second resin insulating layers (50D, 50F, 50H, 50J, 50L, 50N) are sequentially laminated on second resin insulating layer (50B) and second conductive layer (58B). Second conductive layers (58D, 58F, 58H, 58J, 58L, 58N) are formed on second resin insulating layers (50D, 50F, 50H, 50J, 50L, 50N), respectively. Next, the upper and lower second conductive layers are connected to each other by second via conductors (60D, 60F, 60H, 60J, 60L, 60N), which are formed in the resin insulating layers.

Solder resist layer (70F) including openings (71F) is formed on resin insulating layer (50M) of the outermost layer on the upper-surface side. Solder bumps (76F) for connecting the semiconductor device are formed in openings (71F). Solder resist layer (70S) including openings (71S) is formed on resin insulating layer (50N) of the outermost layer on the lower-surface side. Solder bumps (76S) for connection with an external board such as a motherboard are formed in openings (71S).

In the printed wiring board according to the first embodiment, the volume (=area) of first conductive layers (58A, 58C, 58E, 58G, 58I, 58K, 58M) of first buildup layer (55F) is greater than the volume (=area) of second conductive layers (58B, 58D, 58F, 58H, 58J, 58L, 58N) of second buildup layer (55S). Therefore, during thermal contraction, stress is exerted on first buildup layer (55F) and second buildup layer (55S) in such a way that the central portion is raised and the end portions are lowered to cause second buildup layer (55S) to contract.

Therefore, in the third embodiment, in core substrate 30, the resin amount of first resin layers (20A, 20C) is adjusted to be 10.4% greater than the resin amount of second resin layers (20B, 20D). Therefore, the same effects are achieved as those of the above-described first embodiment.

Fourth Embodiment

Figure 13:
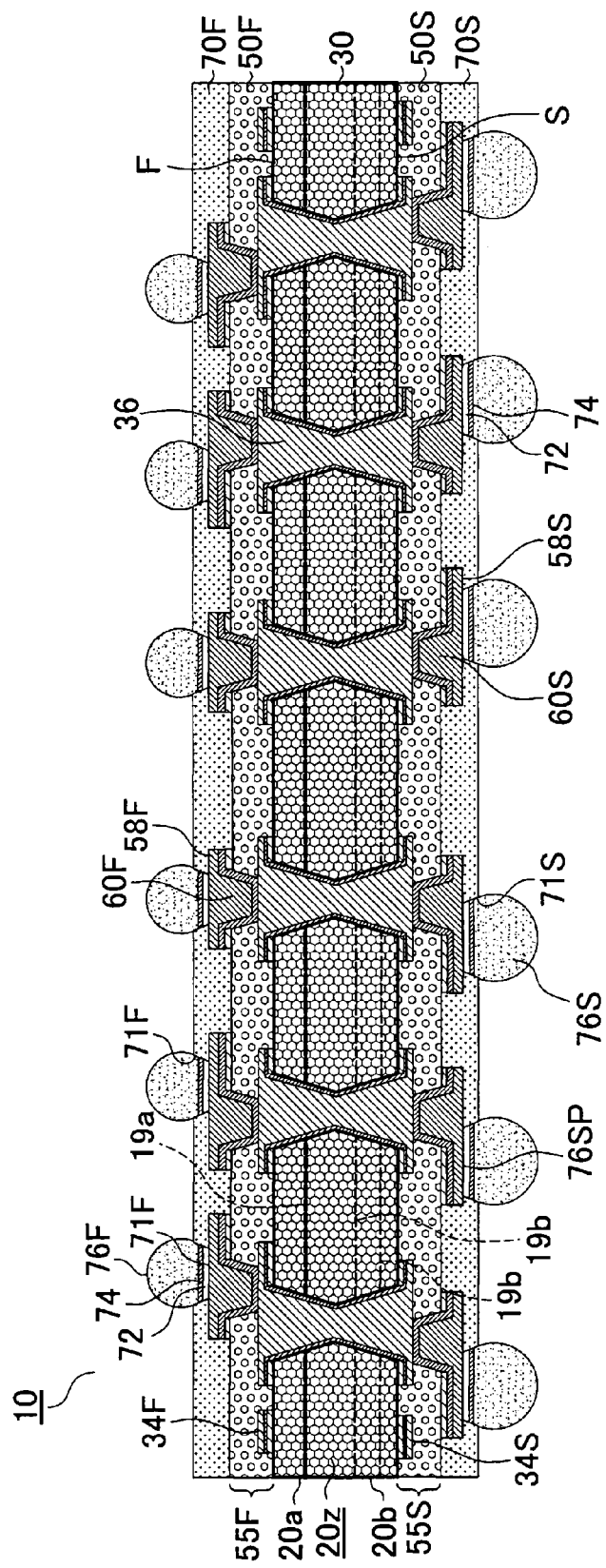
FIG. 13 is a cross-sectional view illustrating a printed wiring board according to a fourth embodiment of the invention.

FIG. 13 is a cross-sectional diagram illustrating a printed wiring board according to a fourth embodiment.

Printed wiring board 10 includes core substrate 30 having a first surface (F) on the side where a semiconductor device (not illustrated) is mounted and second surface (S) opposite the first surface. Core substrate 30 is formed with insulating base material (20z) including first layer (20a) positioned on the first-surface (F) side and second layer (20b) positioned on the second-surface (S) side. Conductive pattern (34F) is formed on the first-surface side of core substrate 30, and conductive pattern (34S) is formed on the second-surface side. Moreover, core substrate 30 is structured to further include connection conductor 36, which connects conductive pattern (34F) and conductive pattern (34S). First layer (20a) of core base material (20z) of core substrate 30 is a layer obtained by curing a single-layered prepreg prepared by forming resin layers on both surfaces of core material (inorganic fiber-reinforcing material) (19a), and second layer (20b) is a layer obtained by curing a double-layered prepreg prepared by forming resin layers on both surfaces of core material (19b).

First buildup layer (55F) is formed on the first-surface side of core substrate 30, and second buildup layer (55S) is formed on the second-surface side. The resin insulating layers of buildup layers (55F, 55S) contain inorganic fiber-reinforcing materials.

First conductive layer (58A) is formed on first resin insulating layer (50A) where first buildup layer (55F) is formed on the first surface of core substrate 30. First conductive layer (58A) and conductive pattern (34C) are connected to each other by first via conductor (60A).

On the other hand, second conductive layer (58B) is formed on second resin insulating layer (50B) where second buildup layer (55S) is formed on the second surface of core substrate 30. Second conductive layer (58B) and conductive pattern (34D) are connected to each other by second via conductor (60B).

Solder resist layer (70F) including openings (71F) is formed on first resin insulating layer (50A) on the upper-surface side. Solder bumps (76F) for connecting the semiconductor device are formed in openings (71F). Solder resist layer (70S) including openings (71S) is formed on second resin insulating layer (50B) on the lower-surface side. Solder bumps (76S) for connection with an external board such as a motherboard are formed in openings (71S).

In the printed wiring board according to the fourth embodiment, the volume (=area) of first conductive layer (58A) of first buildup layer (55F) is greater than the volume (=area) of second conductive layer (58B) of second buildup layer (55S). Therefore, during thermal contraction, stress is exerted on first buildup layer (55F) and second buildup layer (55S) in such a way that the central portion is raised and the end portions are lowered to cause second buildup layer (55S) to contract.

Therefore, in the fourth embodiment, in core substrate 30, the resin amount of first insulating portion (20a) is adjusted to be 10.4% greater than the resin amount of second insulating portion (20b). Therefore, the same effects are achieved as those of the above-described first embodiment.

FIG. 9 is a table listing simulation results of the amount of warpage obtained by adjusting the resin amount of first resin layer (20A) of the core substrate and the resin amount of second resin layer (20B) of the core substrate in a printed wiring board having the configuration of the first embodiment. Hereinafter, in the examples and comparative examples, the configuration of the first buildup layer is the same as that of the second buildup layer.

Figure 10:
FIG. 10 is a graph illustrating simulation results of the amount of warpage.
Figure 10:

As illustrated in FIG. 9, in a comparative example where the resin amount of the first resin layer and the resin amount of the second resin layer are the same, both at 68.6% (the difference is 0%), warpage of 6.9 μm occurs in a plus direction. Herein, the plus direction denotes that, as illustrated FIG. 10A, the central portion of printed wiring board 10 is lowered and the end portions are raised. On the other hand, the minus direction denotes that, as illustrated in FIG. 10B, the central portion of printed wiring board 10 is raised and the end portions are lowered.

In Example 1, the resin amount of the first resin layer is 72.5%, and the resin amount of the second resin layer is 68.6% (the difference is 3.9%). In this case, warpage of 5.9 μm in the plus direction occurs in printed wiring board 10.

In Example 2, the resin amount of the first resin layer is 75.0%, and the resin amount of the second resin layer is 68.6% (the difference is 6.4%). In this case, warpage of 5.4 μm in the plus direction occurs in printed wiring board 10.

In Example 3, the resin amount of the first resin layer is 77.0%, and the resin amount of the second resin layer is 68.6% (the difference is 8.4%). In this case, warpage of 5.1 μm in the plus direction occurs in printed wiring board 10.

In Example 4, the resin amount of the first resin layer is 79.0%, and the resin amount of the second resin layer is 68.6% (the difference is 10.4%). In this case, warpage of 5.5 μm in the minus direction occurs in printed wiring board 10.

In Example 5, the resin amount of the first resin layer is 80.0%, and the resin amount of the second resin layer is 68.6% (the difference is 11.4%). In this case, warpage of 5.6 μm in the minus direction occurs in printed wiring board 10.

In Example 6, the resin amount of the first resin layer is 82.5%, and the resin amount of the second resin layer is 68.6% (the difference is 13.9%). In this case, warpage of 6.1 μm in the minus direction occurs in printed wiring board 10.

In Example 7, the resin amount of the first resin layer is 84.9%, and the resin amount of the second resin layer is 68.6% (the difference is 16.3%). In this case, warpage of 6.5 μm in the minus direction occurs in printed wiring board 10.

In general, it is considered that a thin semiconductor device warps in a range of several microns in the minus direction. Therefore, like the printed wiring boards of Examples 4 to 7, it is preferable for the warpage to occur in the same direction as an IC chip (in the minus direction).

According to one aspect of the present invention, there is provided a printed wiring board including: a core substrate which contains a resin and an inorganic fiber and has a first surface and a second surface opposite the first surface; a first buildup layer which is formed on the first surface of the core substrate and where a resin insulating layer and a first conductive layer on the resin insulating layer are alternately laminated; and a second buildup layer which is formed on the second surface of the core substrate and where a resin insulating layer and a second conductive layer on the resin insulating layer are alternately laminated, wherein sum V1 of volumes of the first conductive layers on the first buildup layer is greater than sum V2 of volumes of the second conductive layers on the second buildup layer, and in the core substrate, a resin amount of the first-surface side of the core substrate is greater than a resin amount of the second-surface side of the core substrate with respect to a center line in a thickness direction of the core substrate as a boundary line.

According to another aspect of the present invention, there is provided a method of manufacturing a printed wiring board, including: forming a core substrate which contains a resin and an inorganic fiber and has a first surface and a second surface opposite the first surface; forming a first buildup layer which is formed on the first surface of the core substrate and where a resin insulating layer and a first conductive layer on the resin insulating layer are alternately laminated; and forming a second buildup layer which is formed on the second surface of the core substrate and where a resin insulating layer and a second conductive layer on the resin insulating layer are alternately laminated, wherein sum V1 of volumes of the first conductive layers on the first buildup layer is set to be greater than sum V2 of volumes of the second conductive layers on the second buildup layer, and in the core substrate, a resin amount of the first-surface side of the core substrate is set to be greater than a resin amount of the second-surface side of the core substrate with respect to a center line in a thickness direction of the core substrate as a boundary line.

In the printed wiring board according to an embodiment of the present invention, the upper and lower surfaces of the core substrate are different from each other in terms of the sum of volumes of conductors. In such a printed wiring board, an amount of thermal contraction of a buildup layer (second buildup layer) where the sum of volumes of conductors is small is relatively large, and warpage occurs.

However, in the core substrate in the printed wiring board, a resin amount of the first-surface side of the core substrate is greater than a resin amount of the second-surface side of the core substrate with respect to a center line in a thickness direction of the core substrate as a boundary line. Therefore, in the core substrate according to an embodiment of the invention, an amount of thermal contraction of the first-surface side is relatively large, and warpage occurs.

Namely, the core substrate can be warped in advance in a direction opposite the direction of the warpage of the printed wiring board during the process of forming the buildup layers. Accordingly, thermal stress causing the thermal contraction of the second buildup layer is offset and weakened during the process of forming the buildup layers, so that warpage of the printed wiring board is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate comprising a resin and an inorganic fiber;
   a first buildup layer formed on a first surface of the core substrate and comprising a plurality of resin insulating layers and a plurality of first conductive layers; and
   a second buildup layer formed on a second surface of the core substrate on an opposite side of the core substrate with respect to the first surface and comprising a plurality of resin insulating layers and a plurality of second conductive layers,
   wherein the plurality of first conductive layers in the first buildup layer has a sum V1 of volumes which is greater than a sum V2 of volumes of the plurality of second conductive layers in the second buildup layer, the core substrate has a first-surface side portion which has a resin amount greater than a resin amount of a second-surface side portion of the core substrate where a boundary line between the first-surface side portion and second-surface side portion of the core substrate is set with respect to a center line in a thickness direction of the core substrate, and the first and second buildup layers are formed such that a ratio V1/V2 of the V1 to the V2 satisfies 1<V1/V2≤1.2 where a difference in the resin amounts between the first-surface side of the core substrate and the second-surface side of the core substrate is in a range of 10 wt % to 20 wt %.

2. The printed wiring board according to claim 1, wherein the core substrate comprises a plurality of insulating layers each comprising a resin and an inorganic fiber, and the plurality of insulating layers have substantially an equal thickness.

3. The printed wiring board according to claim 2, wherein the plurality of insulating layers of the core substrate has a first insulating layer having the first surface of the core substrate and a second insulating layer having the second surface, and the first insulating layer has a resin amount which is greater than a resin amount of the second insulating layer.

4. The printed wiring board according to claim 1, wherein the first buildup layer has an outermost first conductive layer including a plurality of mounting pads positioned to mount a semiconductor device, and the plurality of second conductive layers in the second buildup layer includes an inductor pattern.

5. The printed wiring board according to claim 3, wherein the inorganic fiber in the first insulating layer has a thickness which is smaller than a thickness of the inorganic fiber in the second insulating layer.

6. The printed wiring board according to claim 3, wherein the inorganic fiber in the first insulating layer has air permeability which is higher than air permeability of the inorganic fiber in the second insulating layer.

7. The printed wiring board according to claim 1, wherein the core substrate has a plurality of through holes and a plurality of connection conductors formed in the through holes and comprising plating material filling inner portions of the through holes, respectively, such that the connection conductors form electrical connection through the core substrate.

8. The printed wiring board according to claim 1, wherein the resin insulating layers of the first buildup layer and the resin insulating layers of the second buildup layer do not contain inorganic fibers.

9. The printed wiring board according to claim 1, wherein the first buildup layer is formed such that the resin insulating layers and first conductive layers are alternately laminated, and the second buildup layer is formed such that the resin insulating layers and second conductive layers are alternately laminated.

10. The printed wiring board according to claim 1, wherein the first buildup layer is formed such that the resin insulating layers and first conductive layers are alternately laminated, the second buildup layer is formed such that the resin insulating layers and second conductive layers are alternately laminated, the core substrate comprises a plurality of insulating layers each comprising a resin and an inorganic fiber, and the plurality of insulating layers have substantially an equal thickness.

11. The printed wiring board according to claim 10, wherein the plurality of insulating layers of the core substrate has a first insulating layer having the first surface of the core substrate and a second insulating layer having the second surface, and the first insulating layer has a resin amount which is greater than a resin amount of the second insulating layer.

12. The printed wiring board according to claim 1, wherein the first buildup layer is formed such that the resin insulating layers and first conductive layers are alternately laminated, the second buildup layer is formed such that the resin insulating layers and second conductive layers are alternately laminated, the first buildup layer has an outermost first conductive layer including a plurality of mounting pads positioned to mount a semiconductor device, and the plurality of second conductive layers in the second buildup layer includes an inductor pattern.

13. The printed wiring board according to claim 11, wherein the inorganic fiber in the first insulating layer has a thickness which is smaller than a thickness of the inorganic fiber in the second insulating layer.

14. The printed wiring board according to claim 11, wherein the inorganic fiber in the first insulating layer has air permeability which is higher than air permeability of the inorganic fiber in the second insulating layer.

15. The printed wiring board according to claim 1, wherein the first buildup layer is formed such that the resin insulating layers and first conductive layers are alternately laminated, the second buildup layer is formed such that the resin insulating layers and second conductive layers are alternately laminated, and the core substrate has a plurality of through holes and a plurality of connection conductors formed in the through holes and comprising plating material filling inner portions of the through holes, respectively, such that the connection conductors form electrical connection through the core substrate.

16. The printed wiring board according to claim 1, wherein the first buildup layer is formed such that the resin insulating layers and first conductive layers are alternately laminated, the second buildup layer is formed such that the resin insulating layers and second conductive layers are alternately laminated, and the resin insulating layers of the first buildup layer and the resin insulating layers of the second buildup layer do not contain inorganic fibers.

17. The printed wiring board according to claim 2, wherein the first buildup layer has an outermost first conductive layer including a plurality of mounting pads positioned to mount a semiconductor device, and the plurality of second conductive layers in the second buildup layer includes an inductor pattern.

18. A method of manufacturing a printed wiring board, comprising:
   forming a core substrate comprising a resin and an inorganic fiber;
   forming on a first surface of the core substrate a first buildup layer comprising a plurality of resin insulating layers and a plurality of first conductive layers; and
   forming on a second surface of the core substrate on an opposite side of the core substrate with respect to the first surface a second buildup layer comprising a plurality of resin insulating layers and a plurality of second conductive layers,
   wherein the plurality of first conductive layers in the first buildup layer has a sum V1 of volumes which is greater than a sum V2 of volumes of the plurality of second conductive layers in the second buildup layer, the forming of the core substrate comprises forming the core substrate having a first-surface side portion which has a resin amount greater than a resin amount of a second-surface side portion of the core substrate where a boundary line between the first-surface side portion and second-surface side portion of the core substrate is set with respect to a center line in a thickness direction of the core substrate, and the first and second buildup layers are formed such that a ratio V1/V2 of the V1 to the V2 satisfies $1<V1/V2\leq1.2$ where a difference in the resin amounts between the first-surface side of the core substrate and the second-surface side of the core substrate is in a range of 10 wt % to 20 wt %.

19. The method of manufacturing a printed wiring board according to claim 18, wherein the forming of the core substrate comprises forming the core substrate such that warpage occurs in a downward protruding state during the forming of the core substrate, the forming of the first buildup layer comprises forming the first buildup layer such that warpage occurs in a downward protruding state during the forming of the first buildup layer, and the forming of the second buildup layer comprises forming the second buildup layer such that warpage occurs in a downward protruding state during the forming of the second buildup layer.

20. The method of manufacturing a printed wiring board according to claim 18, wherein the forming of the first buildup layer comprises alternately laminating the resin insulating layers and first conductive layers, and the forming of the second buildup layer comprises alternately laminating the resin insulating layers and second conductive layers.

* * * * *